United States Patent [19]

Arai et al.

[11] Patent Number: 4,569,862
[45] Date of Patent: Feb. 11, 1986

[54] METHOD OF FORMING A NITRIDE LAYER

[75] Inventors: Tohru Arai, Toyoake; Junji Endo, Nagoya, both of Japan

[73] Assignee: Kabushiki Kaisha Toyota Chuo Kenkyusho, Aichi, Japan

[21] Appl. No.: 733,844

[22] Filed: May 14, 1985

[30] Foreign Application Priority Data

May 28, 1984 [JP] Japan .................................. 59-108054

[51] Int. Cl.⁴ .............................................. C23C 16/00
[52] U.S. Cl. .................... 427/255; 118/717; 427/255.2; 427/249
[58] Field of Search ................ 427/249.2, 255.2, 255; 118/717

[56] References Cited

U.S. PATENT DOCUMENTS

| | | | |
|---|---|---|---|
| 3,197,328 | 7/1965 | Jung et al. | 118/717 |
| 4,461,656 | 7/1984 | Ross | 148/16.6 |
| 4,535,000 | 8/1985 | Gordon | 427/255.2 |

FOREIGN PATENT DOCUMENTS

| | | | |
|---|---|---|---|
| 2113853 | 5/1973 | Fed. Rep. of Germany | 427/255.2 |
| 157139 | 9/1983 | Japan | 427/255.2 |

*Primary Examiner*—Shrive P. Beck
*Attorney, Agent, or Firm*—Berman, Aisenberg & Platt

[57] ABSTRACT

A method of forming a layer of a nitride or carbonitride of titanium, vanadium or the like on the surface of an article to be treated includes: disposing a treating material composed of refractory powder, powder of a metal or alloy of a nitride forming element and a halide power, and the article to be treated in a fluidized bed furnace; and introducing a nitrogen-containing gas into the furnace under a heated condition to fluidize the treating material, thereby effecting the surface treatment. This method provides a nitride or carbonitride layer having a smooth surface and a uniform thickness rapidly and safely without using hydrogen and a halogen vapor.

22 Claims, 4 Drawing Figures

(X 400)

(X 400)

4,569,862

METHOD OF FORMING A NITRIDE LAYER

BACKGROUND OF THE INVENTION

1. Field of the Invention

This invention relates to a method for the surface treatment for forming a nitride or carbonitride layer of titanium (Ti), vanadium (V), niobium (Nb), tantalum (Ta), chromium (Cr), manganese (Mn), tungsten (W) or molybdenum (Mo), on an article to be treated by using a fluidized bed furnace. (Hereinafter, these elements will be simply referred to as a nitride forming element.)

2. Description of the Prior Art

Conventionally, there have been known chemical vapor deposition (CVD) method, ion plating method, sputtering method and the like, as an industrial method for coating a nitride of Ti, V, Cr or the like on the surface of metals or non-metallic materials. For example, according to CVD method, the nitride coating can be performed at about 1000° C. by the chemical vapor (phase) reaction. In this method, a halide of the nitride forming element is supplied from the outside of a reacting furnace and therefore, a gas generating apparatus and a gas introducing pipe are necessary. In addition, since a hydrogen gas is used as a carrier gas, there is a danger of explosion. Moreover, since the flow of gas is liable to become nonuniform, it is difficult to form a uniform layer.

On the other hand, each of the ion plating method and sputtering method is a coating method wherein vaporized metal is brought into reaction with a nitrogen gas through the medium of plasma under a reduced pressure. In these methods, too, bonding of the treated article and the nitride layer formed thereon is insufficient and in addition, the apparatus used for this purpose is also complex and expensive.

Recently, a fluidized bed furnace has been used as a heat treating furnace for steel. In this fluidized bed furnace, an alumina powdered body is fluidized with gases such as air, argon gas and the like to obtain a bed of alumina in a fluidized state and the fluidized bed thus obtained is used as a thermal medium for this furnace. This thermal medium has a uniform distribution of temperature and also a rapid thermal conduction. Therefore, with this thermal medium, it is possible to promptly and uniformly heat each portion of the article.

The method of forming a nitride layer using this fluidized bed furnace will be explained in reference to FIG. 2.

First, a treating material, which is composed of a powdered mixture of substance containing a cementing metal and inert substance such as alumina or the like, is disposed over a diffusion plate b provided in a furnace body a of the fluidized bed furnace. Then, a nitrogen gas is introduced into the furnace body a via a gas supplying passage $C_1$ to fluidize the powdered treating material thereby forming a fluidized bed d of the treating material. Subsequently, a lid or cover e put on the upper opening portion of the furnace body a is removed and an article f to be treated is embedded in the fluidized bed d, followed by closing the upper opening portion of the furnace body with the lid e. In this case, careful attention must be paid to maintain the interior of the furnace in an airtight condition. After the furnace reaches the treating temperature, halogen vapor is supplied to the fluidized bed d via another gas supplying passage $C_2$ using hydrogen as a carrier gas therefor. As a result, halogen vapor and powder of the cementing metal react with each other to generate a gas of the halide of the cementing metal. The halide gas is reduced by the hydrogen gas and reacts with the nitrogen gas, thereby depositing a nitride on the surface of the treated article. In this manner, the nitride coating treatment is carried out.

In the aforesaid method employing the conventional fluidized bed furnace, there have been many problems such as great difficulties in handling of the furnace and in operation thereof, as will be described below. Firstly, the method requires the use of halogen vapor for forming the coating layer. Therefore, it is essential to use hydrogen as a carrier gas for carrying the halogen vapor and as a reducing material for the halide gas of the cementing metal. However, the use of hydrogen has many problems in view of safety and it is difficult to use the furnace with efficiency. Secondly, since the furnace is used in the airtight state in order to prevent explosion of hydrogen, the treated article just as it is heated cannot be taken out of the furnace. Therefore, it is difficult to successively perform the subsequent quenching of the article. Thirdly, since this conventional method requires an apparatus for generating the halogen vapor, the furnace is complicated both in construction and in operation.

SUMMARY OF THE INVENTION

Accordingly, an object of the present invention is to provide a method for the nitride coating treatment with safety not employing halogen vapor and hydrogen with a danger of explosion.

Another object of the present invention is to provide a method for the nitride coating treatment, employing a fluidized bed furnace which is simple in structure and operation.

A further object of the present invention is to provide a method for forming a nitride or carbonitride layer having an extremely smooth surface and uniform thickness.

Namely, the present invention is directed to a method of forming a nitride or carbonitride layer on the surface of an article to be treated, which comprises:

disposing the article to be treated and a treating material in a fluidized bed furnace, the treating material comprising a refractory powder, such as alumina, a nitride forming powder composed of at least one nitride forming metal or alloy, and a halide powder composed of one or both of a halogenated ammonium salt and a metal halide which is a sublimable or vaporizable at a temperature not more than a treating temperature and introducing a nitrogen-containing gas into the furnace to carry out the surface treatment in a fluidized state of the treating material and under a heated condition.

These steps may be carried out in any order.

The above and other objects, features and advantages of the present invention will become more apparent from the following description when taken in conjunction with the accompanying drawings in which a preferred embodiment of the invention is shown by way of illustrative example.

DETAILED DESCRIPTION OF THE INVENTION

Figure 1:
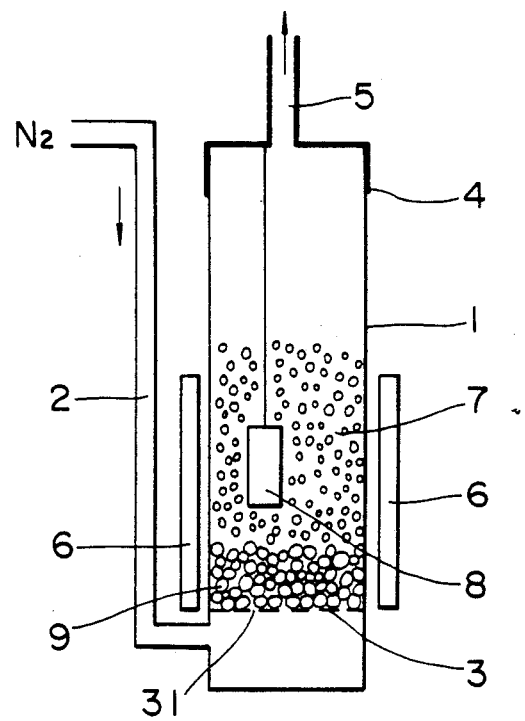
FIG. 1 is an explanatory view illustrating an example according to the present invention.
Figure 2:
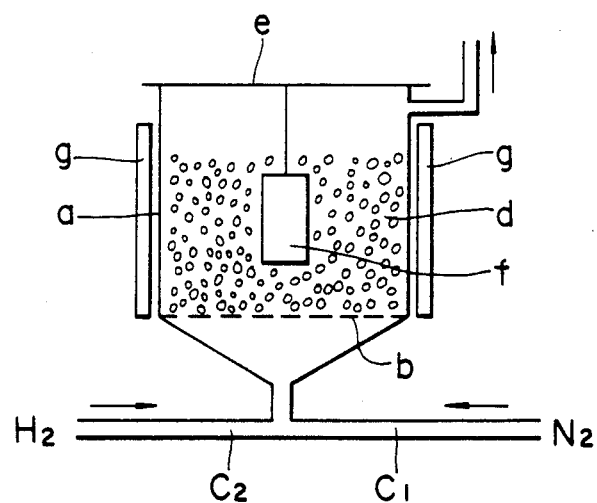
FIG. 2 is a schematic view of a furnace of the prior art.

A fluidized bed furnace for use in the present invention may be one generally used for drying, incineration, reduction or other purposes.

The refractory material is used to prevent a metallic powder from being agglomerated during fluidization and therefore it is preferably a material not reacting with the metallic powder. The refractory material may be selected from alumina ($Al_2O_3$), silicon oxide ($SiO_2$), titanium oxide ($TiO_2$), zirconia ($ZrO_2$) and the like, each of which hardly changes in quality at the treating temperature. One or more of these materials are used for this purpose.

The nitride forming metal is a metal easy to combine with hydrogen and to form a nitride. Typical examples include titanium (IVb-Group element), vanadium, niobium and tantalum (Vb-Group elements), chromium, molybdenum and tungsten (VIb-Group elements), and manganese (VIIb-Group element). Typical examples of the nitride forming alloy include ferrous alloys such as Fe-V, Fe-Nb, Fe-Cr and the like, which are often employed for industrial use.

In order to form a composite layer or a plurality of layers of a nitride or carbonitride, two or more nitride forming metals or alloys may be included in the treating material.

The nitride forming powder composed of one or more of the nitride forming metals or alloys is preferably included in the treating material in an amount of 5 to 50% by weight. If its content is less than 5%, it becomes difficult to form a nitride layer. If it exceeds 50%, the metal powder becomes liable to adhere to the surface of the article.

As a halogenated ammonium salt, one or more of ammonium chloride ($NH_4Cl$), ammonium bromide ($NH_4Br$), ammonium iodide ($NH_4I$), ammonium fluoride ($NH_4F$) and the like may be used. A metal halide which is sublimable and vaporizable at a temperature not more than a treating temperature, may be selected from titanium fluoride ($TiF_4$), vanadium fluoride ($VF_3$), vanadium chloride ($VCl_3$), titanium bromide ($TiBr_4$), iron chloride ($FeCl_3$) and the like, and one or more of these metal halides are used for this purpose. The use of metal halides which do not sublimate and evaporate at such a temperature will cause the dissolution of these metal halides in the fluidized bed, the difficulty of fluidization thereof and sticking of these metal halides to the article. The halide powder is formed of one or both of the aforesaid halogenated ammonium salt and metal halide which sublimates and evaporates at temperatures not more than the treating temperature. The aforesaid halide powder reacts with the nitride forming powder to generate a gas of a halide of the nitride forming element, which gas contributes to the formation of a nitride. In case where halides of the nitride forming element, such as $TiF_4$, $VCl_3$ and the like, are used, the aforesaid halides directly contribute to the formation of the nitride. The content of the halide powder is preferably in the range of 0.2 to 3% by weight. If its content is less than 0.2%, the reaction for forming the nitride is insufficient and the thickness of the nitride or carbonitride layer becomes thin. On the other hand, if the content exceeds 3%, the amount of halide gas generated is increased to cause troubles such as cloging of an exhaust hole and the like.

The treating material comprises the aforesaid nitride forming powder, halide powder and refractory powder. The grain size of each powder is preferably in the range of 60 mesh to 350 mesh. If it is larger than 60 mesh, a large amount of nitrogen-containing gas is required for fluidizing the treating material. As a result, a halide gas generated is dissipated by the large amount of nitrogen-containing gas and thus prevented from reaching the surface of an article to be treated. As a result, the formation of nitride does not proceed. To the contrary, if it is smaller than 350 mesh, the powder is liable to float so that handling of the treating material becomes difficult.

Depending on the treating conditions, powders of the treating material stop up an inlet port of the furnace body for introducing a nitrogen-containing gas and normal fluidization of the treating material may be obstructed. In order to prevent such obstruction, coarse particles of a refractory material, such as alumina or the like, having a grain size of 5 to 20 mesh, may be disposed between the gas inlet and the treating material.

As a gas for the fluidization, a nitrogen-containing gas can be used. In this case, usually, a nitrogen ($N_2$) gas of normal purity is used. In addition, ammonia or the like may be added to the nitrogen gas.

The nitrogen-containing gas is fed into the fluidized bed furnace with a pedetermined pressure and a predetermined flow rate. As a result, the powdered treating material is blown up within the furnace and moreover, these powders do not come down but are kept in a floating state due to a pressure of the nitrogen-containing gas continuously fed into the furnace, thereby forming a fluidized bed movable therein. This nitrogen-containing gas reacts with halide vapor generated by the reaction of the nitride forming powder and halide powder thereby forming a nitride. In this case, if the article to be treated contains carbon, a carbonitride layer is formed on the surface of the article. With a low flow rate of the nitrogen-containing gas, a small amount of the powdered treating material may adhere to the surface of the article. To remove these powders, the treated article may be polished with a wire brush or the like. In order to form a smooth layer with no adhesion of these powders, the flow rate of the nitrogen-containing gas is preferably at least 50 cm/minute within the fluidized bed furnace. However, if the flow rate is too high, the fluidization of the treating material becomes violent and much bubbling occurs. As a result, the operation becomes complicated. Therefore, the upper limit of the flow rate is preferably 700 cm/minute.

Further, in order to cause favorable fluidization and to facilitate the treating operation, the flow rate is still preferably in the range of 60 to 600 cm/minute. On the other hand, the pressure of 0.5 to 2 $kg/cm^2$ at the gas inlet of the fluidized bed furnace, in view of handling.

Examples of articles to be treated in the present invention include: metal materials such as iron, nickel, cobalt and the like; cemented carbides; carbon-containing materials mainly composed of graphite; nonmetallic materials such as a sintered body of an oxide such as alumina and the like. Particularly, for preventing spalling of the nitride layer due to applied stress, materials having considerable hardness on the surface and inside thereof are preferred. For example, steel or the like subjected to quench hardening, a cobalt alloy, a nickel alloy, a cemented carbide and the like are effectively treated.

When an article to be treated is a carbon-containing material, carbon contained in the article easily bonds to the nitride to form a carbonitride layer on the article. In this case, the article should preferably contain at least 0.1% by weight of carbon.

According to the present invention, the heating process is performed by heating the fluidized bed as a thermal medium. In one method, a fluidized bed furnace including a fluidized bed is disposed in an external heater such as an electric furnace or the like to heat the fluidized bed from the outside thereof, and in another method the fluidized bed is directly heated by a heater disposed in the fluidized bed furnace. The heated fluidized bed comes into contact with the article to be treated for heating the same, thereby forming a nitride or carbonitride layer on the surface of the article.

The treating temperature is selected in the range of 700° C. to 1200° C. If the temperature is lower than 700° C., the nitride layer cannot be formed with a sufficient thickness. If it exceeds 1200° C., the treating material becomes liable to agglomerate or the quality of the treating material may be deteriorated.

The treating time is selected in the range of 0.5 to 16 hours depending on the thickness of the nitride or carbonitride layer to be formed and the property of the material to be treated. If the heating time is shorter than 0.5 hours, it is sometimes impossible to form a layer having a sufficient thickness. If it exceeds 16 hours, the quality of the article may be deteriorated. For obtaining the nitride or carbonitride layer having a uniform thickness, the treating time may be relatively short with high treating temperatures, while with low treating temperatures, the treating time showed be relatively long.

In the present invention, the treating material and the article to be treated are disposed in the fluidized bed furnace beforehand, followed by heating the furnace and introducing the nitrogen-containing gas into the furnace, or first followed by introducing the nitrogen-containing gas into the furnace and then heating the furnace. Otherwise, the nitrogen-containing gas is fed into the furnace under the heated condition and then the treating material and the article to be treated are disposed in the furnace.

The method of this invention employs a powder of a halogenated ammonium salt or a powder of a metal halide without using halogen. Thus, the method dispenses with hydrogen as a carrier gas for carrying the halogen vapor into the furnace and as a reducing material. Consequently, there is no danger of explosion and the nitride coating treatment can be performed with safety. In addition, since the article to be treated can directly be introduced into the hot fluidized bed, it is possible to heat the article rapidly. Accordingly, the method of the invention can employ a fluidized bed furnace which is simple in construction and easy to operate.

Further, since the treating material in a fluidized state is employed as the thermal medium, there is no adherence of the material to the surface of the article. Therefore, the treated article has a smooth surface. Moreover, since the temperature distribution of the fluidized bed is uniform, it is also possible to form a nitride layer having a uniform thickness on the surface of the article. If the carbon-containing material is employed as an article to be treated, a carbonitride layer can be formed thereon. If two or more metals or alloys of the nitride forming elements are employed, it is possible to form a composite or two or more layers of the nitride or carbonitride on the surface of the article, with a simple treating operation.

Hereinafter, several preferred embodiments of this invention will be explained.

EXAMPLE 1

Using a fluidized bed furnace as shown in FIG. 1, the nitride coating treatment according to this invention was carried out. In the fluidized bed furnace, there is provided a furnace body 1 which has at its bottom a gas inlet connected to a gas supplying passage 2. A diffusion plate 3 is provided immediately above the gas inlet to divide the interior of the furnace into two chambers. The diffusion plate 3 is provided with a plurality of gas diffusion holes 31 bored through the plate in the thickness direction thereof. There was disposed on the diffusion plate 3, 500 g of coarse particles of alumina 9 having a grain size of 5 to 20 mesh, in order to prevent these diffusion holes from being stopped up with the treating material and to improve the diffusion state of the nitrogen-containing gas. The upper portion of the furnace body 1 is covered or closed with a removable lid 4 and a gas exhausting passage 5 opens into a predetermined portion of the lid 4. At the outer periphery of the furnace body 1, there is a heater 6. The furnace body 1 is made of a heat resistant steel and formed into a column measuing 60 mm in diameter and 800 mm in height.

One kg of powdered treating material was placed on coarse particles of alumina 9 in the fluidized bed furnace. The treating material contained 60.5% by weight of alumina powder (60 to 100 mesh), 39% by weight of ferrovanadium powder containing 70% by weight of vanadium (100 to 200 mesh) and 0.5% by weight of ammonium chloride powder (80 to 200 mesh). Subsequently, a nitrogen ($N_2$) gas as the nitrogen-containing gas was introduced into the furnace body 1 through the gas supplying passage 2. The pressure of the $N_2$ gas was 1.5 kg/cm² at the gas introducing inlet port of the furnace body and the flow rate thereof within the fluidized bed furnace was 70 cm/minute.

Figure 3:
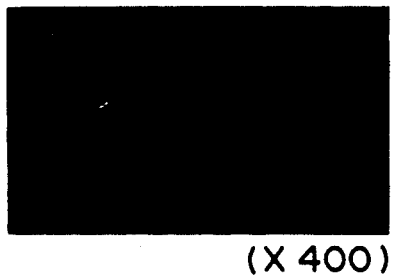
FIGS. 3 and 4 are respectively microphotographs of 400 magnifications which show cross sections of carbonitride layers obtained by Examples 1 and 4 of this invention.

As a result, the powdered treating material was fluidized into a fluidized bed 7 in the furnace body 1. Then, the lid 4 was removed from the upper portion of the furnace body 1 and an article 8 to be treated made of carbon tool steel JIS (Japanese Industrial Standard) SK4 (200 mm in height and 7 mm in diameter), was suspended in the fluidized bed using a supporting member. The fluidized bed 7 was heated to 950° C. from the outer side of the furnace body 1 by a heater 6. The article was heated for 2 hours at the aforesaid temperature and allowed to cool. Upon observing the surface of the article thus obtained with eyes, there was found no adhesion of the treating material to the article and the surface thereof was smooth. Then, the section of the treated article was observed by a microscope and it was observed, as shown in the microphotograph of FIG. 3, that a layer of 2 to 3 μm was formed uniformly on the surface of the article. As a result of the analysis by an X-ray diffraction method and by an X-ray microanalyzer, the formed layer was identified as a vanadium carbonitride [V(NC)] layer containing a small amount of carbon. It had a Vickers' hardness of about 3500.

In a further test, pure iron was employed as an article to be treated and the nitride coating treatment was carried out under the same conditions as described above. As a result, a vanadium nitride (VN) layer having a thickness of 2 to 3 μm was formed on the surface of the pure iron.

EXAMPLE 2

The nitride coating treatment was carried out using carbon tool steel JIS SK4 under the same conditions as in EXAMPLE 1, except that the nitrogen gas had a pressure of 1.5 kg/cm$^2$ at the gas introducing inlet of the furnace body and a flow rate of 500 cm/minute in the furnace. The surface of the treated article had no adhesion of the treating material and a vanadium carbonitride layer containing a small amount of carbon was formed thereon. The layer was extremely smooth and the thickness thereof was 2 to 3 μm.

EXAMPLE 3

One kg of treating material powder was prepared. The treating material contained 10% by weight of ferrovanadium powder including 70% by weight of vanadium (100 to 150 mesh), 1% by weight of ammonium chloride powder (80 to 100 mesh), the balance being alumina powder (80 to 100 mesh). The nitride coating treatment was carried out using steel JIS SK4 as an article to be treated under the same conditions as in EXAMPLE 2. As a result, the surface of the treated article had no adhesion of the treating material and a vanadium carbonitride layer containing a small amount of carbon was formed on the article. The layer was smooth and the thickness thereof was 2 to 3 μm.

EXAMPLE 4

Figure 4:
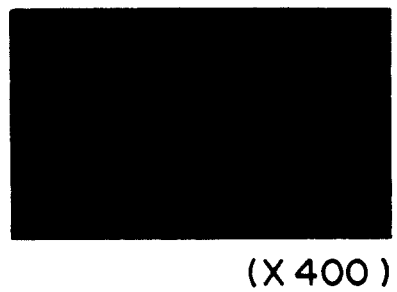

One kg of treating material powder was prepared. The material contained 45% by weight of ferrotitanium powder including 45% by weight of titanium (100 to 150 mesh), 1.5% by weight of ammonium chloride powder (80 to 200 mesh), the balance being alumina powder (60 to 100 mesh). Using the treating material thus prepared, an article to be treated of JIS SK4 steel was subjected to the nitride coating treatment under the same conditions as in EXAMPLE 1. The microphotograph of the surface of the treated article is shown in FIG. 4. On the surface of the article, there was formed a smooth layer having a thickness of 0.5 to 1 μm. The analysis by an X-ray diffraction method and an X-ray microanalyzer showed that the layer was a titanium carbonitride [Ti(NC)] layer having a small amount of carbon dissolved therein.

EXAMPLE 5

One kg of treating material powder was prepared. The material contained 37% by weight of ferrotitanium powder including 45% of titanium (100 to 150 mesh); 3% by weight of titanium fluoride powder (80 to 200 mesh) as a metallic halide powder, the balance being alumina powder (60 to 100 mesh). Using this material, an article of JIS SK4 was treated under the same conditions as in EXAMPLE 1. As a result, there was formed a smooth titanium carbonitride [Ti(NC)] layer having a thickness of 2 to 3 μm on the surface of the article.

What is claimed is:

1. A method of forming a nitride or carbonitride layer on the surface of an article to be treated, which comprises the steps of:

disposing a treating material and the article to be treated in a fluidized bed furnace, said treating material comprising a refractory powder, a nitride forming powder composed of at least one nitride forming metal or alloy and a halide powder composed of at least one of a halogenated ammonium salt and a metal halide which is sublimable or vaporizable at a temperature not more than a treating temperature; and introducing a nitrogen-containing gas into said furnace under heat to fluidize said treating material to thereby form a nitride or carbonitride layer on the surface of said article.

2. A method according to claim 1, wherein said treating material contains 5 to 50% by weight of said nitride forming powder and 0.2 to 3% by weight of said halide powder, the balance being said refractory powder.

3. A method according to claim 1, wherein said refractory powder comprises at least one of alumina, silicon oxide, titanium oxide and zirconia.

4. A method according to claim 1, wherein said nitride forming metal is at least one selected from the group consisting of titanium, vanadium, niobium, tantalum, chromium, manganese, molybdenum and tungsten.

5. A method according to claim 1, wherein said halogenated ammonium salt is at least one selected from the group consisting of ammonium chloride, ammonium bromide, ammonium iodide and ammonium fluoride.

6. A method according to claim 1, wherein said metal halide is at least one selected from the group consisting of titanium fluoride, vanadium fluoride, vanadium chloride, titanium bromide and ferric chloride.

7. A method according to claim 1, wherein said treating material has a grain size of 60 to 350 mesh.

8. A method according to claim 1, wherein said nitrogen-containing gas is selected from a nitrogen gas and a nitrogen gas containing ammonia.

9. A method according to claim 1, wherein said nitrogen-containing gas has a flow rate of at least 50 cm per minute in said furnace.

10. A method according to claim 9, wherein said flow rate is in the range of 50 to 700 cm per minute.

11. A method according to claim 10, wherein said flow rate is in the range of 60 to 600 cm per minute.

12. A method according to claim 1, wherein said nitrogen-containing gas has a pressure of 0.5 to 2 kg/cm$^2$ at an inlet of said furnace.

13. A method according to claim 1, wherein said article is formed of a material selected from the group consisting of iron, nickel, cobalt or an alloy thereof, a cemented carbide article and graphite.

14. A method according to claim 1, wherein said article contains at least 0.1% by weight of carbon to form a carbonitride layer on the surface of said article.

15. A method according to claim 1, wherein said heating temperature is in the range of 700° to 1200° C.

16. A method according to claim 1, wherein said heating time is in the range of 0.5 to 16 hours.

17. A method according to claim 1, wherein coarse particles of refractory powder having a grain size of 5 to 20 mesh are further disposed in said furnace between a gas inlet thereof and said treating material, thereby preventing said gas inlet from being closed due to said treating material.

18. A method according to claim 2, wherein said treating material has a grain size of 60 to 350 mesh, said flow rate is in the range of 50 to 700 cm per minute and said heating temperature is in the range of 700° to 1200° C.

19. A method according to claim 18, wherein coarse particles of refractory powder having a grain size of 5 to 20 mesh are further disposed in said furnace between a gas inlet thereof and said treating material, and said nitrogen-containing gas is nitrogen gas.

20. A method according to claim 19, wherein said treating material comprises ferrovanadium powder, ammonium chloride powder and alumina powder.

21. A method according to claim 19, wherein said treating material comprises ferrotitanium powder, ammonium chloride powder and alumina powder.

22. A method according to claim 19, wherein said treating material comprises ferrotitanium powder, titanium fluoride powder and alumina powder.

* * * * *